(12) United States Patent
White et al.

(10) Patent No.: US 6,686,755 B2
(45) Date of Patent: Feb. 3, 2004

(54) METHODS FOR WIRELESS TESTING OF INTEGRATED CIRCUITS

(75) Inventors: Stanley A. White, San Clemente, CA (US); Kenneth S. Walley, Portola Hills, CA (US); James W. Johnston, Rancho Santa Margarita, CA (US); P. Michael Henderson, Tustin, CA (US); Kelly H. Hale, Aliso Viejo, CA (US); Warner B. Andrews, Jr., Boulder, CO (US); Jonathan I. Siann, San Diego, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/764,689

(22) Filed: Jan. 16, 2001

(65) Prior Publication Data

US 2001/0005145 A1 Jun. 28, 2001

Related U.S. Application Data

(62) Division of application No. 09/046,011, filed on Mar. 23, 1998, now Pat. No. 6,331,782.

(51) Int. Cl.[7] .................... G01R 31/28; G01R 31/302

(52) U.S. Cl. ........................................ 324/763; 324/765
(58) Field of Search ................................ 324/763, 765; 714/733, 734

(56) References Cited

U.S. PATENT DOCUMENTS 5,764,655 A * 6/1998 Kirihata et al. ............. 714/733
6,161,205 A * 12/2000 Tuttle .......................... 714/733

* cited by examiner

Primary Examiner—Ernest Karlsen
(74) Attorney, Agent, or Firm—Thomas, Kayden, Horstemeyer & Risley, LLP

(57) ABSTRACT

A system for testing a microelectronic circuit includes a test bed for mounting a microelectronic circuit, and a signal source for applying a signal to a microelectronic circuit mounted on the test bed. The system additionally includes a test probe for wirelessly receiving electromagnetic response signals from the microelectronic circuit mounted on the test bed. In a preferred form, the electromagnetic response signals are radio-frequency signals. The test system additionally includes a computer connected to be test probe for analyzing the electromagnetic response signals. An integrated circuit for testing on the test system has a test circuit portion that emits electromagnetic radiation in response to a predetermined signal applied to the test circuit.

17 Claims, 7 Drawing Sheets

METHODS FOR WIRELESS TESTING OF INTEGRATED CIRCUITS

RELATED APPLICATION

This application is a divisional of U.S. application Ser. No. 09/046,011 filed Mar. 23, 1998, now U.S. Pat. No. 6,331,782.

BACKGROUND OF THE INVENTION

The present invention pertains to testing microelectronic circuits such as semiconductor integrated circuits.

Electronic circuits, including semiconductor integrated microelectronic circuits, are tested during and after the manufacturing process. Testing verifies that the circuit has been accurately fabricated and is functioning properly.

Test circuits are sometimes included in the design of an integrated circuit. These test circuits are designed to generate particular responses to known inputs. In addition, test points are established in the circuit at which signals in the circuit may be monitored during testing.

Electrical paths are provided to the test circuits and to the test points so that the signals to be monitored may be detected. In addition, in certain circumstances, the tester may be required to supply specific known test inputs to the test circuit or to a particular point in the circuit so that a particular function may be tested.

Each of these input paths and output paths generally requires a contact point at which external test apparatus may be connected. Each such contact point includes a pad on the integrated circuit to which a test probe may be attached (for testing at the die stage), and an external pin (for testing after packaging).

A conductive path, or trace, is designed into the integrated circuit to conduct the signal to be observed from the point on the circuit on which it is generated to a point at which a contact pad and/or pin can be provided. Generally these contact pads are placed at the perimeter of the integrated circuit. A trace also may be necessary to provide a path for an input test signal from a contact pad to a particular point in the circuit.

Contact points such as pads on the integrated circuit or pins in the packaged device for device testability are readily available when the tester is required only to test the overall device by supplying input signals to the regular device input, and by observing the output signals at the regular device output. The tester can simply contact the regular signal input and output points of the device to perform such a test. However, the tester may be required to observe a point other than the regular device input and output. Each additional point to which test contact is desired requires an additional contact pad and pin, and an additional trace from the circuit point to be observed to the contact pad.

The additional contact point or points, and the traces from the contact points to the circuit points to be tested, complicate the design of integrated circuits. Sometimes the designer is forced to decide between testability and efficient design. For example, there may not be sufficient room for an additional contact pad on the integrated circuit to provide a test contact. Or, there may not be an available pin on the package. In other circumstances, a conductive trace from a point in the circuit to a contact pad may interfere with other aspects of the circuit design.

Once testing of the microelectronic device is completed, the test circuit and the electrical connections to the test circuit usually have no useful function. However, they continue to occupy space in the device. On the integrated circuit, the pads for the input and output pins for the test circuit consume valuable chip "real estate." In addition, physical size often limits the number of input and output pins that may be included on a packaged chip. Pins on the packaged device needed only for testing may displace pins that could be used for other purposes related to the operation of the integrated circuit for its intended purpose by its ultimate user.

SUMMARY OF THE INVENTION

It is an object of the present invention to provide an improved system for testing electronic circuits.

It is an object of the present invention to provide an integrated circuit having improved testability.

It is an object of the present invention to provide an improved method of testing microelectronic circuits.

It is an object of present invention to provide a method of testing electronic circuits using a minimum of space on the circuit.

It is an object of the present invention to provide an apparatus for, and a method of, testing an integrated circuit without requiring special test contact pads on the integrated circuit.

It is an object of the present invention to provide improved testability of microelectronic devices without requiring extra input and output pins.

It is an object of the present invention to provide the ability to probe an internal test point in a microelectronic device.

A system for testing a microelectronic circuit in accordance with the invention includes a test bed for mounting a microelectronic circuit, and a signal source for applying a signal to a microelectronic circuit mounted on the test bed. The test system additionally includes a test probe for receiving electromagnetic response signals from the microelectronic circuit mounted on the test bed. In a preferred form, the electromagnetic response signals are radio-frequency signals. The test system additionally includes a computer connected to the test probe for analyzing the received signals.

An integrated circuit constructed for testability in accordance with the invention includes a test circuit portion that emits electromagnetic radiation in response to a predetermined signal applied to the test circuit.

A combination of an integrated circuit and an apparatus for testing that integrated circuit may be constructed in accordance with the invention. The combination includes an integrated circuit incorporating a test circuit portion. The test circuit portion of the integrated circuit is configured so that as a first electrical effect is generated in the test circuit portion the test circuit portion emits electromagnetic radiation. The test device of the combination includes an electromagnetic radiation receiver for detecting electromagnetic radiation emitted by the test circuit portion of the integrated circuit, and an analyzer for analyzing the electromagnetic radiation detected by the receiver.

A method of testing a semiconductor integrated circuit in accordance with the invention includes applying a predetermined signal to the integrated circuit to cause the integrated circuit to emit electromagnetic radiation. An electromagnetic receiver detects the electromagnetic radiation emitted by the integrated circuit. The electromagnetic radiation detected by the receiver is analyzed by a computer analyzer.

DETAILED DESCRIPTION OF A PREFERRED EMBODIMENT

Figure 1:
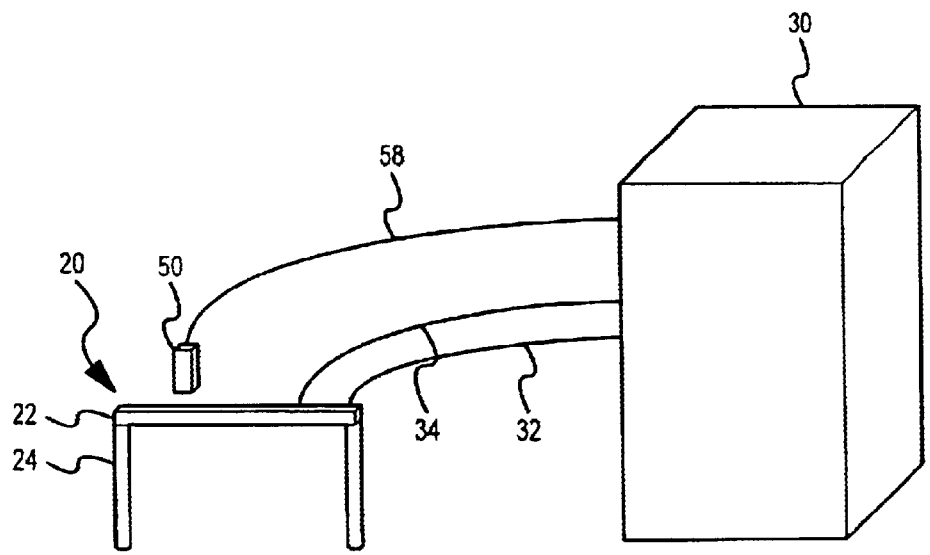
FIG. 1 is a perspective view of a system incorporating the present invention for testing a microelectronic device.

A system for testing an integrated circuit or microelectronic circuit device is shown in FIG. 1. The system includes a test bed 20 for mounting a microelectronic circuit (not shown in FIG. 1). The test bed includes a surface 22. The surface 22 may be substantially horizontal, although other orientations are possible. The surface 22 may be supported by a support mechanism, such as legs 24.

The test bed 20 is electrically connected to a signal source and signal analyzer. The signal source and analyzer may be a single computer 30, such as a programmed electronic microcomputer. The connections between the test bed 20 and the computer 30 are described below.

Figure 2:
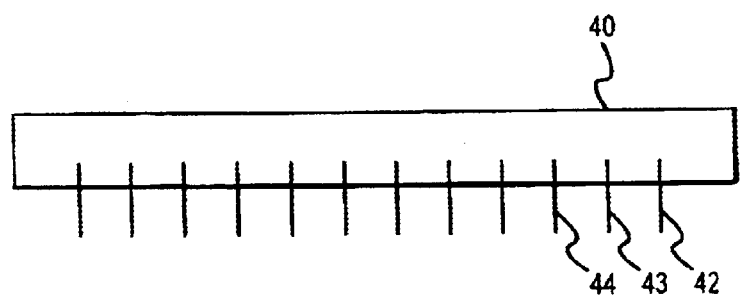
FIG. 2 is a side view of a microelectronic device suitable for testing using the test system shown in FIG. 1.
Figure 5:
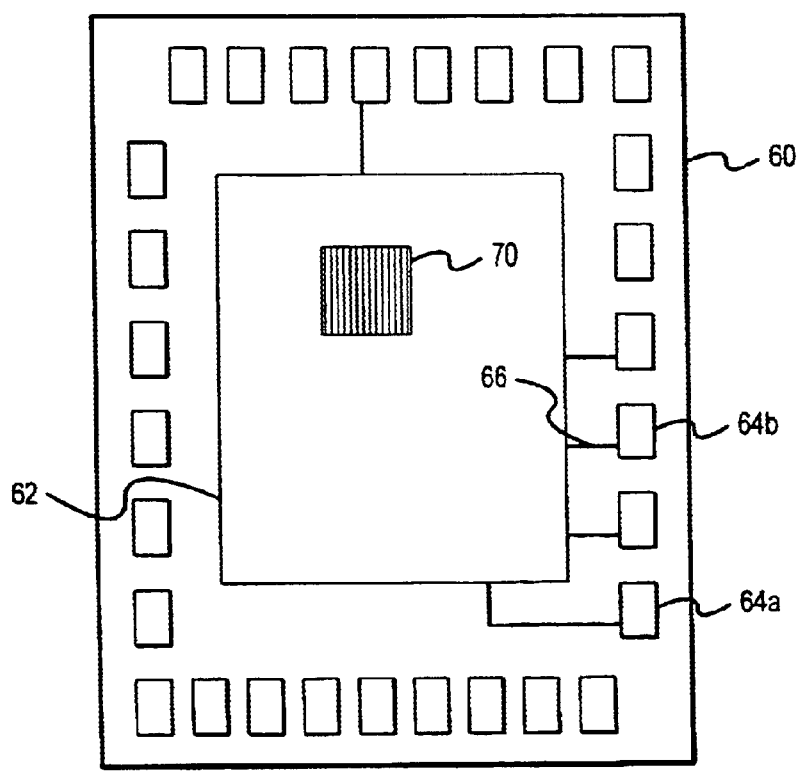
FIG. 5 is a plan view of an integrated circuit included in the microelectronic device shown in FIG. 2, and incorporating an aspect of the present invention.

The microelectronic device to be tested by the apparatus shown in FIG. 1 may be in the form of a packaged device 40, as shown in FIG. 2, or a bare die, such as the die 60 shown in FIG. 5. Additional types of packaging are also used in the industry, and may encapsulate the microelectronic circuitry to be tested. Devices packaged in such other packaging technologies may also be tested on the system shown in FIG. 1.

The packaged device 40 includes several pins 42–44. Each pin provides a connection to a particular portion of the microelectronic circuit within the device 40. These connections are provided in a conventional manner. For example, the pin 42 may be an input pin for receiving a signal to be processed by the device 40. The pin 44 may be an output pin on which the device produces the output of its processing of the input signal that is received on the input pin 42.

The test bed 20 includes a mechanism for receiving or mounting the device to be tested. The nature of the device receiving mechanism depends on the nature of the device to be tested. Such mechanisms may be of conventional construction, and are well understood in the microelectronic circuit arts.

Figure 3:
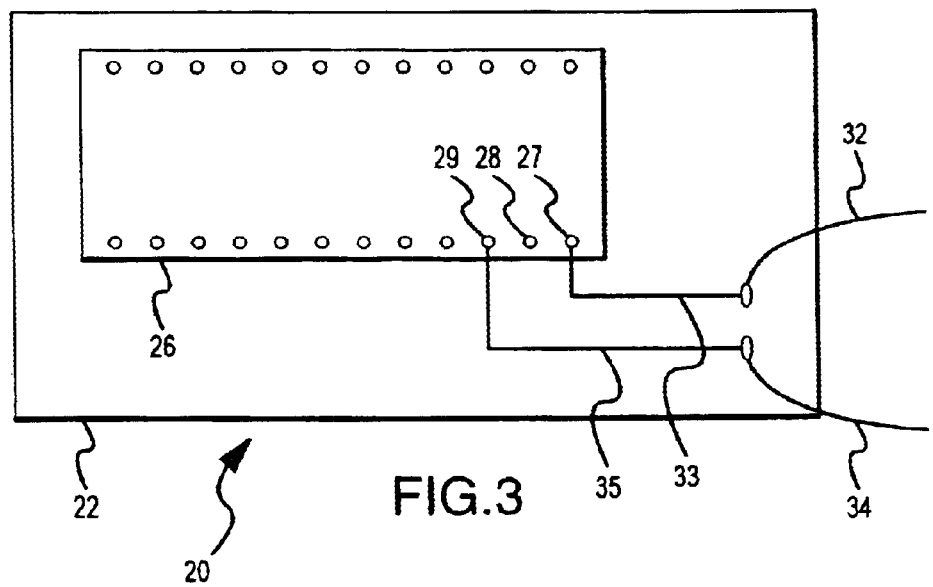
FIG. 3 is plan view of a test bed that may be included in the test system shown in FIG. 1.

A representative mechanism for receiving a packaged microelectronic device such as the device 40 is a receptacle 26 in the surface 22 of the test bed 20 (FIG. 3). The receptacle 26 may have several sockets 27–29, each for receiving a corresponding one of the pins 42–44 on the device 40 (FIG. 2). For example, a signal input socket 27 may be positioned to receive the device input pin 42, and a signal output socket 29 may be positioned to receive the device output pin 44. Those skilled in the art will recognize that other types of contacts are conventionally available for providing electrical contact between the test bed and the other forms of the microelectronic device to be tested.

The test system includes a mechanism for applying a test signal to the microelectronic device 40 when the microelectronic device is mounted on the test bed 20. This mechanism may include a signal source in the computer 30 (FIG. 1).

In many applications, at least a portion of the test procedure for the device includes applying a known input signal to the regular signal input pin of the device, and analyzing the output from the device. For such testing, a test signal may be applied to the device input pin 42. Such a test signal may simulate an input that the device 40 would receive during regular operation. A signal source wire 32 conducts the test signal from the computer signal source 30 to the test bed 20. Test bed input wiring 33 (FIG. 3) in the test bed 20 conducts the test signal to the input pin 42 on the device 40 when the device 40 is mounted on the test bed.

As best shown in FIG. 3, the signal source wire 32 is connected to the internal test bed input wire 33 in the test bed 20. The test bed input wire 33 is connected to the input socket 27 of the receptacle 26. Thus, when the device 40 is inserted into the receptacle 26, a signal may be conducted from the computer 30 through the signal source wire 32, the test bed input wire 33, and the signal input socket 27 to the device input pin 42.

A return signal path may be provided from the device output pin 44 to the signal analyzer computer 30. Such a return signal path allows the computer 30 to analyze the output of the device 40 as the device 40 processes the signal applied to the device input pin 42 through the signal source wire 32.

The return signal path may be provided by an output wire 34 and an internal test bed output wire 35. The internal test bed output wire 35 is connected to the signal output socket 29 in the receptacle 26. The signal output wire 34 connects the internal test bed output wire 35 to the computer 30.

In accordance with the present invention, signals in a portion of the device 40 other than at the device output pin 44 may be analyzed. For example, a response may be obtained from a portion of the circuitry between the device input pin 42 and the device output pin 44 for analysis. In contrast with the techniques of the prior art, this analysis may be performed without physical contact between the test equipment and the microelectronic circuitry within the device 40.

Electromagnetic response signals may be transmitted, radiated, or emitted from a portion of the electronic circuitry within the device 40. These electromagnetic response signals may be emitted in response to particular test signals applied to the device. The test signals may be applied through the test signal source wire 32 to the signal input pin 42 of the device 40.

In accordance with an aspect of the present invention, a test circuit portion is fabricated as a part of the circuitry of the microelectronic device 40. The test circuit portion generates an electrical effect that may be detected by a receiver 54 of a test probe 50 shown in FIG. 6. For example, the test circuit portion may emit electromagnetic radiation in response to particular signals propagating in the microelectronic device 40.

FIG. 5 shows a representation of the semiconductor integrated circuit or die 60 that may be included in the device 40. As is conventional in the art, the die 60 includes a circuitry portion 62 and several contact pads 64. Conductive leads or traces 66 connect the circuitry 62 with the pads 64. The pads provide contact points for external wiring. For example, a first pad 64a may be the contact pad for the signal input for the circuitry 62. The device input lead or pin 42 contacts that first pad 64a. A second pad 64b may be the contact pad for the signal output from the circuitry 62. The device output pin 44 contacts this second contact pad 64b.

The circuitry 62 includes a test circuit portion 70. The test circuit portion 70 emits electromagnetic radiation in response to particular electrical effects or signals applied to it. For example, the test circuit portion 70 may emit particular electromagnetic radiation in response to particular conditions in the surrounding portion of the circuitry 62. The probe 50 of the test system (FIG. 1) detects the electromagnetic radiation emitted by the test circuit portion 70.

As will be recognized and understood by those skilled in the art, a moving electrical charge (a current) generates a magnetic field. A moving magnetic field generates an electric field having a voltage, which can give rise to an electrical current. This pair of phenomena allows the electrical signals or the electrical effects in the test circuit portion 70 of the die 60 in the device 40 to be wirelessly communicated to the test probe 50.

The test circuit portion 70 of the microelectronic circuitry 62 converts electrical signals into electromagnetic radiation that may correspond to those signals. In one form, the electromagnetic radiation may be radio-frequency radiation. For example, the information of a first electrical signal in the circuitry 62 may be modulated onto a radio-frequency (RF) carrier wave generated in the test circuit portion 70. If the test circuit portion 70 modulates or encodes a signal onto an RF carrier, the modulation may be frequency modulation or spread spectrum encoding.

In other embodiments, infrared radiation may be used to carry the information. An on-chip infrared generator (not shown) in the test circuit portion 70 may be used to encode the test information onto an infrared beam. Yet further embodiments may incorporate one or more on-chip lasers (not shown) to transmit information. The information is modulated or encoded onto a beam of coherent optical radiation (light) emitted by the on-chip laser. The on-chip laser is a part of the test circuit portion 70.

Figure 4:
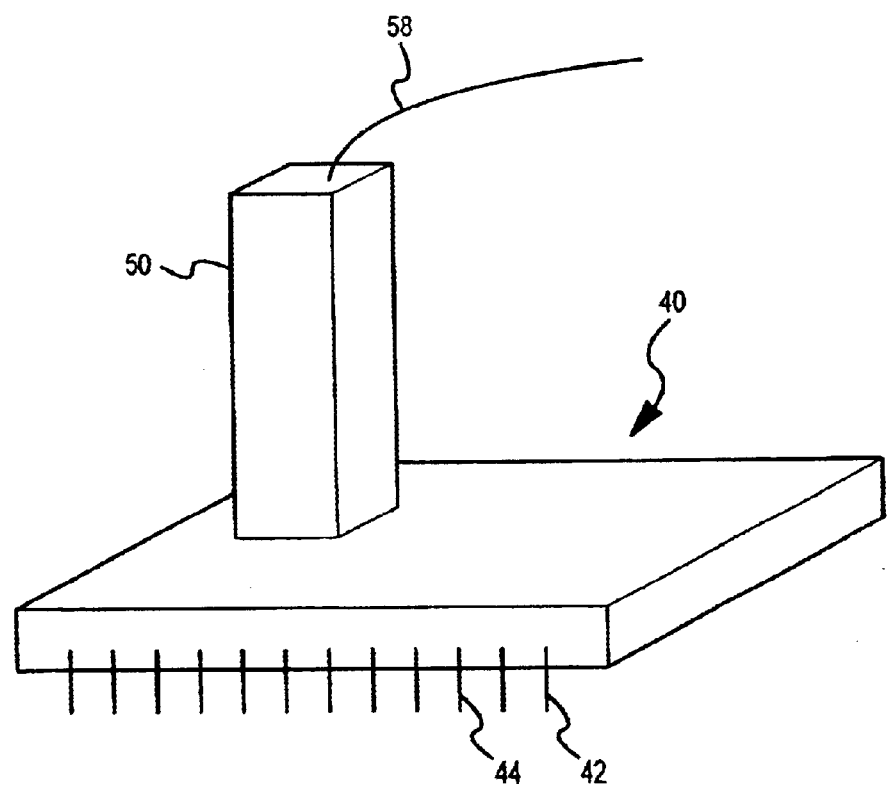
FIG. 4 is a perspective view of the microelectronic device of FIG. 2 and a portion of the test system of FIG. 1.

The test probe 50 receives or detects the electromagnetic response signals emitted by the test circuit portion 70 of the microelectronic device 40 mounted on the test bed 20. The test probe 50 may be placed near the microelectronic device 40 to detect the emitted radiation. As shown in FIG. 4, the probe 50 may be positioned above the microelectronic device 40 when the microelectronic device 40 is mounted in the receptacle 26 of the test bed 20 (see also FIG. 7).

The response signals detected by the probe 50 are directed from the probe 50 to the computer 30 through an electrical test response connection 58.

The computer 30 analyzes the response signals received by the probe 50. This analysis of the response signals can be helpful in determining that the circuitry of the device 40 is operating appropriately. The specific analysis procedure performed by the computer 30 depends on the particular feature to be analyzed. Those familiar with the testing of microelectronic circuitry are familiar with such analysis programs.

Figure 6:
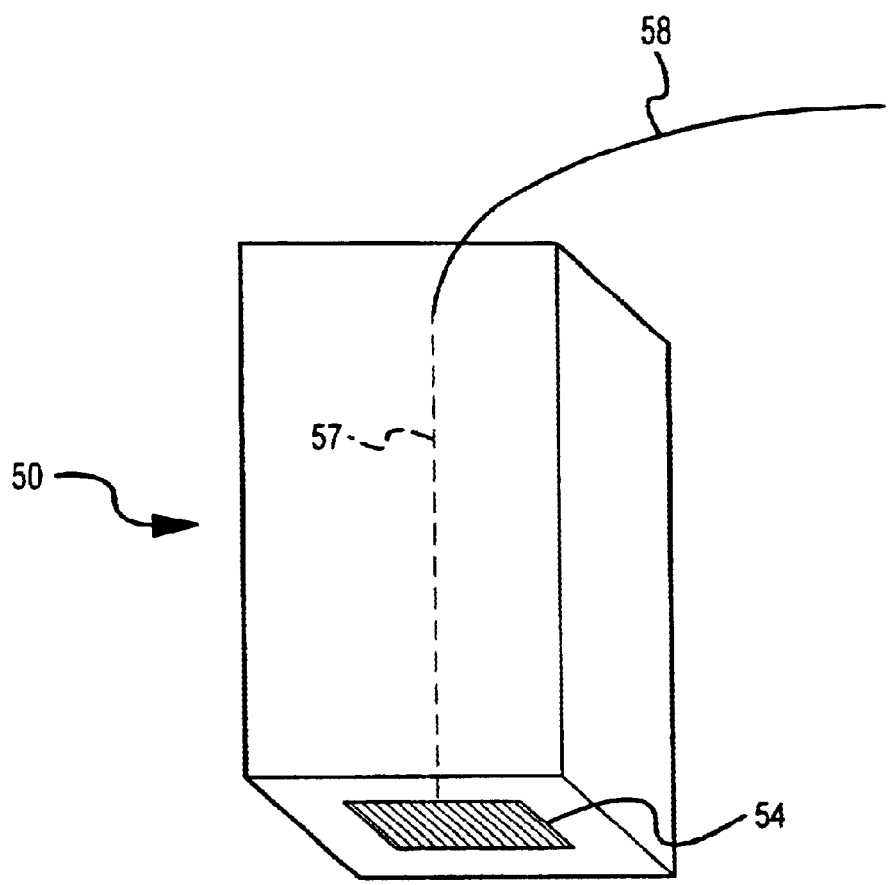
FIG. 6 is a perspective view of a test apparatus probe incorporating an aspect of the present invention.

The test probe 50 includes an electromagnetic receiver 54, as shown in FIG. 6. The electromagnetic receiver 54 may be included on the bottom of the test probe 50 so that it may be brought into close proximity with the device 40 when the device 40 is mounted in the receptacle 26 on the top surface 22 of the test bed 20.

The receiver 54 of the test probe 50 may additionally include certain signal processing circuitry for processing signals received by the receiver 54. The signal processing circuitry may also be separate from the receiver 54. A conduit 57 provides a signal path from the receiver 54 to the electrical test response connection 58.

The receiver 54 on the test probe 50 detects the RF signal emitted by the test circuit portion 70. The receiver 54 then demodulates or decodes the information from the detected RF signal. Encoding or modulation allows the receiver 54 of the test probe 50 to distinguish the RF signals emitted by the test circuit portion 70, and to distinguish those signals from the background noise. In addition, the use of unique encoding such as is available with spread spectrum encoding allows the test probe 50 to separately detect signals from multiple test circuit portions 70 that may be included in a single device 40.

In a simplified embodiment, those skilled in the art will recognize that electrical currents in the test circuit portion 70 may be inductively coupled to the receiver 54 of the test probe 50 to provide the electromagnetic response signals. Similarly, voltages in the test circuit portions 70 may be capacitively coupled to the receiver 54 of the test probe 50 to provide the electromagnetic response signals.

These electrical principles permit information to be transferred from the test circuit portion 70 to the test probe 50 wirelessly. Such wireless communication of information from the test circuit portion 70 eliminates the need to provide a separate pad on the die 60 for the sole purpose of testing. Eliminating the need for such a pad on the die 60 also eliminates the need for a corresponding contact pin on the packaged device 40. Furthermore, because the test circuit portion may usually be placed at or near the point of interest in the circuitry 62, there is no need for an extensive conductive trace or lead to a test probe contact point.

How closely the receiver 54 of the test probe 50 must be to the test circuit portion 70 of the circuitry 62 is a function of the distance over which the receiver 54 may accurately detect and decode signals transmitted by the test circuit portion 70. The probe 50 preferably may be placed close enough to the test circuit portion 70 that the receiver 54 on the probe 50 detects the radiation emitted by the test circuit portion 70 without an antenna or amplification devices.

In embodiments in which signals are inductively coupled from the test circuit portions 70 to the receiver 54, the spacing between the test circuit portion 70 and receiver 54 is small enough so that any electromagnetic inductance appears in the receiver 54 in response to a changing current in the test circuit portion 70. Embodiments in which capacitive coupling occur have the test circuit portion 70 and receiver 54 close enough that voltages may be capacitively coupled between circuits.

For the receiver 54 of the test probe 50 to accurately receive radio-frequency signals emitted by the test circuit portion 70, the test probe 50 may be positioned so that the receiver 54 is within 10 cm of the test circuit portion 70 when the device 40 is mounted on the test bed 20.

Figure 7:
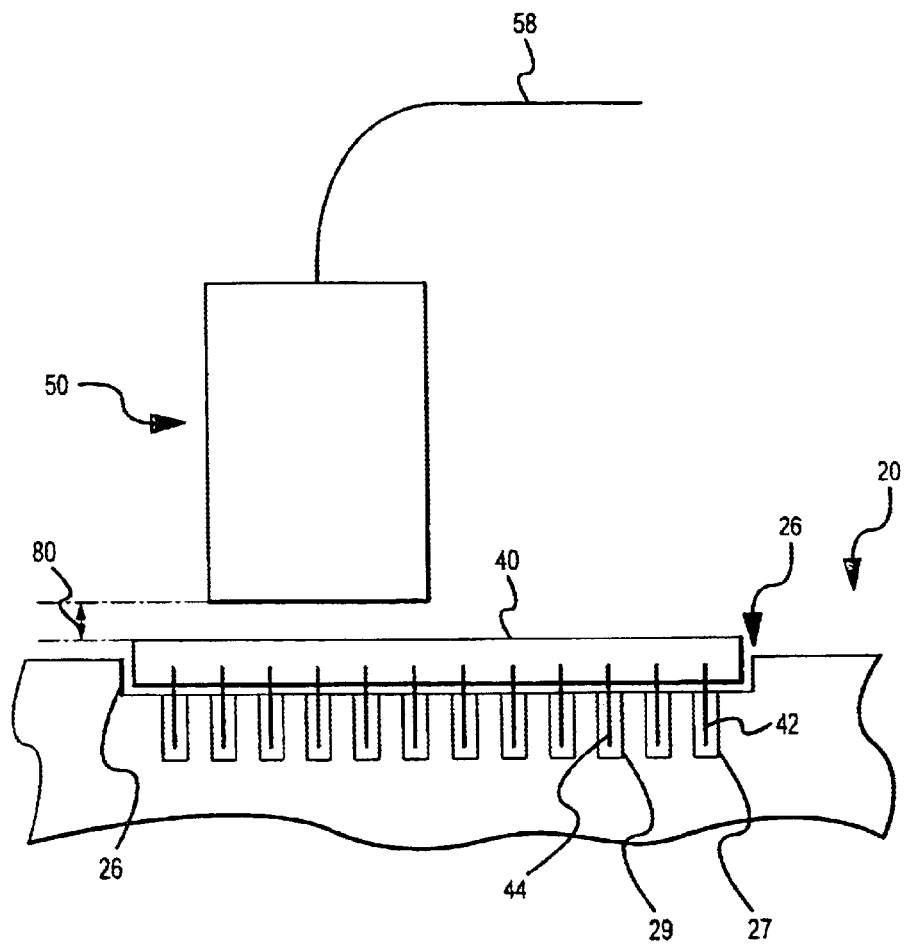
FIG. 7 is a side view of a portion of the test system of claim 1, with a microelectronic device on the test bed.

Preferably, the test probe 50 may be moved horizontally over the surface of the test bed 20, and positioned so that the receiver 54 is directly over the test circuit portion 70 of the die 60 of the microelectronic device 40. Referring to FIG. 7, the test probe 50 is shown positioned directly over the microelectronic device 40, which is mounted in the receptacle 26 of the test bed 20.

The vertical spacing 80 between the test probe 50 and the device 40 is such that the receiver 54 on the bottom surface of the test probe 50 is within 10 cm of the test circuit portion 70 of the die 60 contained within the microelectronic device 40.

The package material of the packaged device 40 has a thickness over the die 60 containing the test circuit portion 70. In addition, a protective covering or packaging on the end of the probe 50 may add a thickness of material over the receiver 54. These two thicknesses of material may be approximately ½ cm each. Therefore, the spacing 80 between the end of the test probe 50 and the top surface of the package device 40 is less than the spacing between the test circuit portion 70 and the receiver 54. The spacing 80 may be approximately 1 cm less than the spacing between the test circuit portion 70 and the receiver 54.

If the receiver 54 is positioned directly over the test circuit portion 70, the spacing 80 is less than 10 cm, less the thickness of any packaging material covering the surface of the receiver 54 and on the device 40. To achieve spacing of 10 cm or less between the receiver 54 and of the test circuit portions 70, the spacing 80 between the probe 50 and the top surface of the device 40 may be less than 9 cm.

Preferably, the spacing 80 is arranged so that the test probe 50, and in particular the receiver 54 of the test probe 50, is within 3 cm of the device 40. It is particularly preferable that the receiver 54 of the test probe 50 be positioned within 3 cm of where the test circuit portion 70 is on the circuit 60 within the device 40.

Ideally, the test probe is positioned so that the spacing between the test circuit portion 70 and the probe receiver 54 is approximately 1 cm. Such spacing may require that the test probe 50 virtually or actually touch the top surface of the packaged microelectronic device 40.

With any spacing greater than 10 cm, there is a probability that the test probe receiver 54 will detect and process signals or other electromagnetic radiation that may originate from a source other than the test circuit portion 70. In addition, at larger distances, the signal-to-noise ratio becomes smaller. A low signal-to-noise ratio may keep the receiver 54 from correctly decoding the information transmitted or emitted by the test circuit portion 70.

In many applications, the greater the spacing between the test circuit portion 70 and the receiver 54 on the probe 50, the greater the power that must be supplied to the test circuit portion 70. Therefore, design choices may be required between the closeness to which the test probe 50 may be brought and the power consumption of the device 40 during testing.

Those skilled in the art will recognize that anisotropic radiation from a transmission point yields a power relationship that is inverse to the cube of the distance from the transmission point ($1/r^3$). Thus, for the receiver 54 to receive the same power level, the power supplied to the test circuit portion 70 when the receiver 54 is 2 cm from the test circuit portion 70 must be eight times the power supplied when the receiver 54 is 1 cm from the test circuit portion 70. However, those skilled in the art will also recognize that each electrical conduit in the vicinity of the transmitting test circuit portion 70 and of the receiver 54 affects the received power function. Therefore, each different design of the circuitry 62 of the die 60 in the device 40, of the test circuit portion 70, and of the receiver 54 will yield a different power reception function. Consequently, each design of the test circuit portion 70 and the surrounding circuitry 62 will require laboratory testing to identify the particular power transmission requirements for that combination.

Figure 8A:
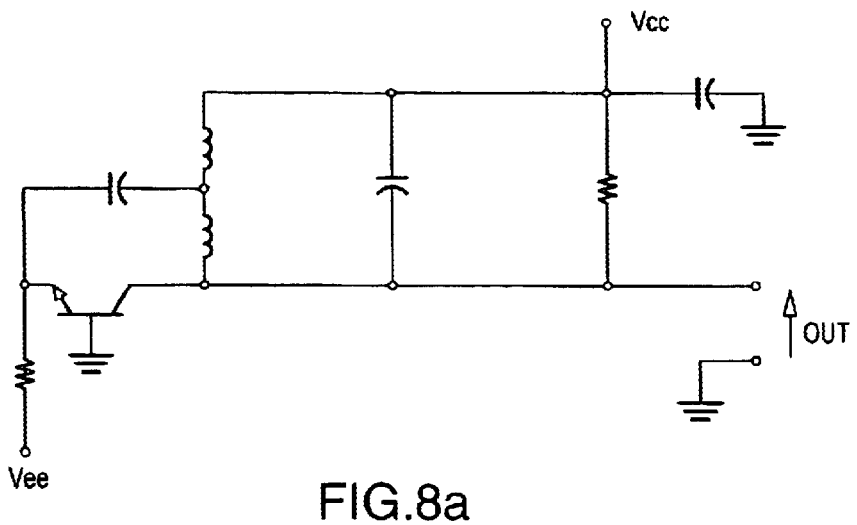
FIGS. 8a and 8b are circuit diagrams of electromagnetic transmitters that may be incorporated in the integrated circuit shown in FIG. 5 in accordance with an aspect of the present invention.

Many specific designs for the radiating or transmitting segment of the test circuit portion 70 may be used. The transmitting segment of the test circuit portion 70 may be an RF oscillator. FIG. 8a shows an NPN Hartley oscillator that may be used as the radiating segment of the test circuit portion 70. The NPN Hartley oscillator is simple and easy to design into a microelectronic circuit, such as the circuit 62.

Figure 8B:
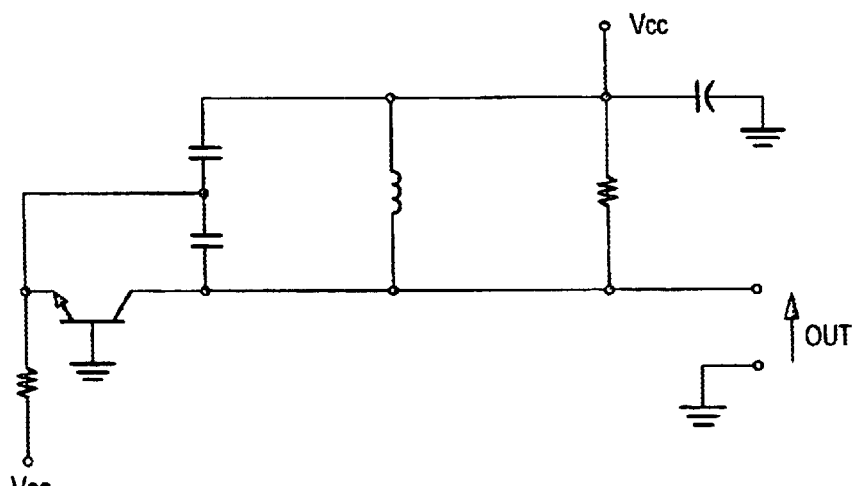

FIG. 8b shows an NPN Colpitts oscillator that may also be used in the radiating segment of the test circuit portion 70. The NPN Colpitts oscillator may be particularly beneficial for use in circuits in which oscillation frequencies of greater than 10 MHz are desired. The Hartley and Colpitts oscillators, as well as other oscillators that may also be incorporated into the circuit design, are well understood in the art.

Figure 9:
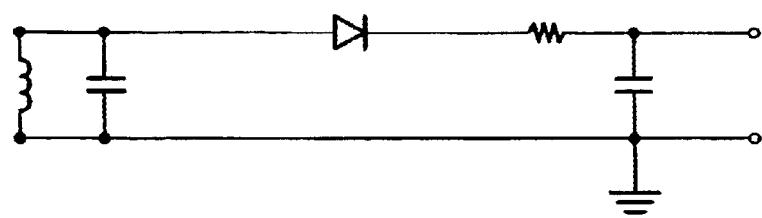
FIG. 9 is a circuit diagram of a receiver that may be incorporated in the probe shown in FIG. 6 in accordance with an aspect of the present invention.

A simple detector/demodulator that may be used in the receiver 54 is shown in FIG. 9. The detector/demodulator of the receiver 54 is tuned to the frequency of the oscillator of the corresponding segment of the test circuit portion 70. The detector/demodulator shown in FIG. 9 and other detector/demodulators are also well understood by those skilled in the art.

The specific frequency at which the oscillator of the transmitting segment of the test circuit portion 70 operates will depend on the application, and the nature of the signals to be transmitted from the test circuit portion 70 to the receiver 54 of the test probe 50.

The transmitting segments of the test circuit portions use little power, and are small in size. These features enable them to readily fit into the circuitry designs of microelectronic devices.

As noted above, certain applications may include more than one test circuit portion 70 in a single integrated circuit die 60. Each additional transmitter segment of a test circuit portion, or each different test circuit portion may use a slightly different transmission frequency. A particularly beneficial arrangement is to use encoded spread spectrum signals. Each transmitting segment of the circuitry being tested may have its own unique encoding. Multiple test circuit portions 70 in different parts of the circuit allow the test system probe 50 to scan the circuit to observe multiple parts of the device. In accordance with the invention, this scanning may be done without having to include significant extra wiring in the circuit device 60.

In certain applications, it may be desirable to apply a special test signal to the microelectronic device 40 other than through the device's normal input terminal. In such applications, the test probe 50 may additionally include an electromagnetic transmitter (not shown). Such an electromagnetic transmitter may be integrated with the receiver circuit 54. The electromagnetic transmitter may transmit electromagnetic radiation, such as radio frequency signals, to the test circuit portion 70 of the die 60. In such an application, the test circuit portion 70 also includes an electromagnetic receiver. Thus, in this embodiment, the test circuit portion 70 includes an electromagnetic transmitting segment and an electromagnetic receiving segment. The probe receiver 54 also includes an electromagnetic transmitting segment and an electromagnetic receiving segment. Different modulation frequencies or spread spectrum encoding may be used by the transmitting segment of the receiver 54 and by the transmitting segment of the test circuit portion 70. Such different frequencies or encoding allow the transmitting segments of the receiver 54 and the test circuit portion 70 to operate simultaneously.

The test circuit portion 70 may be designed as a "macro" that may be used in many different microelectronic devices. Thus, the same test circuit portion design may be repeatedly used, reducing design costs of multiple microelectronic devices.

Those skilled in the semiconductor testing art will also recognize that semiconductor devices may be tested prior to packaging using the test system described above. When pre-packaging testing is to be performed, the test bed 20 is designed to accommodate a bare die, such as the die 60 (FIG. 6). Test signals may be applied to the input points of the die by a touching a probe to the device input pads, such as the pad 64a of the die 60.

Those skilled in the art will also recognize that the test bed may additionally be modified to accommodate devices in different types of packaging. Thus, devices may be tested regardless of their packaging type.

The system, microelectronic device, and method described here permit the wireless probing of circuitry internal to a microelectronic device, without requiring that conductive leads or traces to the perimeter of the chip be included, and without requiring additional pins that would be used for testing only.

Having been provided with the above description, those having skill in the art will be able to design a variety of specific embodiments and implementations. For example, other forms of in electromagnetic transmission from the microelectronic device to the test apparatus may be developed, other specific embodiments of the transmitting segment of the test circuit portion and of the receiver may be designed, and other forms of the test bed may be configured. Thus, the above description is intended to the exemplary, and not limiting.

We claim:

1. A method of testing a semiconductor integrated circuit, the method comprising the steps of:

providing an integrated circuit configured to emit electromagnetic radiation in response to receiving a predetermined signal;

applying said predetermined signal to said integrated circuit via an electrical signal input to said integrated circuit to cause said integrated circuit to emit electromagnetic radiation, wherein said predetermined signal does not provide a power source for said integrated circuit; and wirelessly detecting, without using an external antenna, said electromagnetic radiation emitted by said integrated circuit by placing an electromagnetic receiver near said integrated circuit.

2. The testing method of claim 1, wherein said electromagnetic radiation emitted by said integrated circuit is radio frequency radiation.

3. The testing method of claim 1, wherein said step of wirelessly detecting said electromagnetic radiation comprises placing said electromagnetic radiation receiver within 10 cm of said integrated circuit.

4. The testing method of claim 1, wherein said step of wirelessly detecting said electromagnetic radiation comprises placing said electromagnetic radiation receiver within 3 cm of said integrated circuit.

5. The method of claim 1, additionally comprising the step of analyzing with a programmed electronic computer said wirelessly detected electromagnetic radiation.

6. The testing method of claim 1, wherein said electromagnetic radiation emitted by said integrated circuit is infrared radiation.

7. The testing method of claim 1, wherein said electromagnetic radiation emitted by said integrated circuit is coherent optical radiation.

8. A method of using test equipment to test an electrical circuit within an electronic device, the method comprising the steps of:

placing a probe of the test equipment within 10 cm of the electrical circuit;

applying a first test signal to the electrical circuit via an electrical signal input to the electrical signal, wherein the first test signal does not provide a power source for said electrical circuit;

generating, by the electrical circuit in response to the first test signal, a radio frequency carrier wave;

encoding, by the electrical circuit, information onto the carrier wave to produce a modulated wave;

wirelessly detecting, without using an external antenna, by the probe, the modulated wave; and decoding by the test equipment, the information about the modulated wave.

9. The method of claim 8 further comprising the step of using the probe to wirelessly apply a second test signal to the electrical circuit.

10. The method of claim 8 further comprising the step of analyzing, by the test equipment, the decoded information.

11. A method for wireless testing of integrated circuits, comprising the steps of:

applying an electrical input signal from a testing device to an integrated circuit through an electrical signal input of said integrated circuit that is electrically connected to said testing device, wherein said electrical input signal does not provide a power source for said integrated circuit;

applying an electromagnetic input signal from said testing device to said integrated circuit by way of a probe electrically connected to said testing device emitting said electromagnetic input signal and said integrated circuit sensing said electromagnetic input signal; and receiving an electromagnetic output signal from said integrated circuit to said testing device by way of said integrated circuit emitting said electromagnetic output signal in response to at least one of said electrical input signal and said electromagnetic input signal and said probe, without using an external antenna, sensing said electromagnetic output signal.

12. The method of claim 11, wherein:

said step of applying an electromagnetic input signal further comprises modulating said electromagnetic input signal prior to said probe emitting said electromagnetic input signal and demodulating said electromagnetic input signal after said integrated circuit senses said electromagnetic input signal; and said step of receiving an electromagnetic output signal further comprises modulating said electromagnetic output signal prior to said integrated circuit emitting said electromagnetic output signal and demodulating said electromagnetic output signal after said probe senses said electromagnetic output signal.

13. The method of claim 11, wherein:

said step of applying an electromagnetic input signal further comprises encoding said electromagnetic input signal prior to said probe emitting said electromagnetic input signal and decoding said electromagnetic input signal after said integrated circuit senses said electromagnetic input signal; and said step of receiving an electromagnetic output signal further comprises encoding said electromagnetic output signal prior to said integrated circuit emitting said electromagnetic output signal and decoding said electromagnetic output signal after said probe senses said electromagnetic output signal.

14. The method of claim 11, wherein said electromagnetic input signal and said electromagnetic output signal are radio-frequency signals.

15. The method of claim 11, wherein said electromagnetic input signal and said electromagnetic output signal are infra-red signals.

16. The method of claim 11, wherein said electromagnetic input signal and said electromagnetic output signal are optical-radiation signals.

17. The method of claim 11, wherein the step of applying an electromagnetic input signal further comprises positioning said probe within a proximity of no more than 10 cm of said integrated circuit.

* * * * *